(12) United States Patent
Scoggins et al.

(10) Patent No.: US 11,860,194 B2
(45) Date of Patent: Jan. 2, 2024

(54) SOCKET-JAW PROTECTION MODULE FOR A METER

(71) Applicant: Honeywell International Inc., Charlotte, NC (US)

(72) Inventors: Sean M. Scoggins, Rolesville, NC (US); Vlad Pambucol, Raleigh, NC (US); Michael Anthony Murphy, Raleigh, NC (US); Thomas Owen McBride, Four Oaks, NC (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 12 days.

(21) Appl. No.: 17/512,910

(22) Filed: Oct. 28, 2021

(65) Prior Publication Data
US 2022/0365111 A1 Nov. 17, 2022

Related U.S. Application Data

(60) Provisional application No. 63/187,966, filed on May 13, 2021.

(51) Int. Cl.
*G01R 11/04* (2006.01)
*G01R 22/06* (2006.01)

(52) U.S. Cl.
CPC ............ *G01R 11/04* (2013.01); *G01R 22/065* (2013.01)

(58) Field of Classification Search
CPC ........ G01R 11/02; G01R 11/04; G01R 22/06; G01R 22/061; G01R 22/065; G01R 22/066; G01R 22/068; G01D 4/00; G01D 4/02
See application file for complete search history.

(56) References Cited

U.S. PATENT DOCUMENTS

| 5,153,600 A | 10/1992 | Metzler et al. |
| 6,152,764 A * | 11/2000 | Robinson .............. G01R 11/04 361/666 |

(Continued)

FOREIGN PATENT DOCUMENTS

| CN | 111774318 A | 10/2020 |
| EP | 1750368 A1 | 2/2007 |

(Continued)

OTHER PUBLICATIONS

Itron, LTE Exernal Antenna, Specifications; retrieved from https://www.itron.com/-/media/feature/products/documents/spec-sheet/101461sp01-lte-external-antenna_web.pdf Retrieved on: Apr. 30, 2020 (2 pages total).

(Continued)

*Primary Examiner* — Huy Q Phan
*Assistant Examiner* — David B Frederiksen
(74) *Attorney, Agent, or Firm* — Stevens & Lee PC; John Maldjian, Esq.

(57) ABSTRACT

One embodiment is a device, which comprises a meter portion having one or more blades, the blades configured to reside within both a premises-side opening and a utility-side opening within a socket, a supply unit connected to the meter portion, a metering unit connected to the supply unit and configured to measure an amount of electricity that passes through the meter portion, and a sensor connected to the meter portion, wherein when the meter portion is placed in the socket, the sensor collects data associated with the placing of the meter portion in the socket.

16 Claims, 6 Drawing Sheets

(56) References Cited

U.S. PATENT DOCUMENTS

| | | | |
|---|---|---|---|
| 6,766,698 B1* | 7/2004 | Robinson | G01L 5/0057 |
| | | | 439/839 |
| 9,506,960 B2 | 11/2016 | Tseng et al. | |
| 9,615,150 B2 | 4/2017 | Kashiwagi et al. | |
| 9,714,965 B2 | 7/2017 | Crittenden | |
| 10,753,810 B2* | 8/2020 | Mastrogiacomo | G01L 1/16 |
| 2004/0130843 A1 | 7/2004 | Tsutsui et al. | |
| 2006/0044203 A1 | 3/2006 | Shirosaka et al. | |
| 2006/0254356 A1 | 11/2006 | Liu et al. | |
| 2007/0210969 A1 | 9/2007 | Vance | |
| 2010/0164825 A1 | 7/2010 | Lee | |
| 2011/0063172 A1 | 3/2011 | Podduturi | |
| 2012/0060606 A1* | 3/2012 | Lakich | G01R 22/066 |
| | | | 73/514.16 |
| 2012/0126793 A1* | 5/2012 | Loy | G01R 22/063 |
| | | | 324/142 |
| 2013/0002510 A1 | 1/2013 | Azulay et al. | |
| 2013/0241798 A1 | 9/2013 | Lee et al. | |
| 2013/0289788 A1* | 10/2013 | Gupta | H02J 3/14 |
| | | | 700/291 |
| 2014/0157907 A1 | 6/2014 | Johnson et al. | |
| 2014/0306846 A1 | 10/2014 | Nakatsu et al. | |
| 2015/0061644 A1* | 3/2015 | Parks | G01R 1/0408 |
| | | | 324/126 |
| 2016/0209464 A1* | 7/2016 | Crittenden | G01R 22/068 |
| 2017/0187116 A1 | 6/2017 | Hong et al. | |
| 2020/0169050 A1* | 5/2020 | Walsh | H01H 71/025 |

FOREIGN PATENT DOCUMENTS

| | | |
|---|---|---|
| KR | 20080067914 A | 7/2008 |
| KR | 101364941 B1 | 2/2014 |

OTHER PUBLICATIONS

PulseLarsen Antennas: Smart Meetering, Retrieved from: https://pulselarsenantennas.com/wp-content/uploads/2017/05/PulseLarsen_SmartMeter_Flyer_2017.pdf Retrieved on: Apr. 30, 2020 (11 pages total).

Philips Magnetic Products, "Cable Shielding", Philips Components, Document order No. 9398 237 28011, Date of release: Feb. 1997, Philips Electronics N.V. 1998 (27 pages total).

Parker, Carole U., "Using Ferrites to Suppress EMI" Jul. 1, 2011, Retrieved from: https://incompliancemag.com/article/using-ferrites-to-suppress-emi/ Retrieved on: Mar. 31, 2021 (43 pages total).

Brooks Utility Products, A Tyden Group Company "Portable Meter Socket Jaw Tester", 2020, Retrieved from: http://www.brooksutility.com/products/122, Retrieved on: Nov. 4, 2020 (2 pages total).

Powergrid International, Metering, Smart Grid, Issue 12 and vol. 19, "Preventing Electric Meter Fires: Two Perspectives", Dec. 15, 2014 (16 pages total).

* cited by examiner

SOCKET-JAW PROTECTION MODULE FOR A METER

CROSS-REFERENCE TO RELATED APPLICATIONS

This application claims the benefit of U.S. Provisional Application Ser. No. 63/187,966 filed May 13, 2021, entitled "SOCKET-JAW PROTECTION MODULE FOR A METER", which is incorporated herein by reference in its entirety. This application incorporates by reference in its entirety, application Ser. No. 17/191,384 entitled "ELECTRIC METER HAVING GAS SENSOR FOR ARC DETECTION", filed Mar. 3, 2021.

BACKGROUND

Residential and commercial premises generally include meters to allow a utility company to monitor the consumption of electricity. An electric meter, for example, includes an outer utility box and includes a meter socket having openings (sometimes referred to as jaws) configured for receiving blades, where the utility box is generally positioned on an outside wall of the premises. Inside the utility box is a meter shell having therein a meter portion generally implemented on a printed circuit board (PCB). The PCB includes measurement circuitry for measuring the consumption of electricity. The PCB also includes a communications unit with a radio transmitter, for example, which can communicate the electricity consumption measurements to a central system of the utility (e.g., for billing and for other purposes).

The premises-side of the meter is electrically connected by the blades to premises-side openings of the meter socket, and the blades also extend to utility-side openings of the meter socket. Various types of damage from wear, improper installation, or other faults, are common in the meter socket. Fires and other catastrophic events have been traced to arcing in the meter socket and it is directly related to the damaged socket (or a hot socket). The damage is caused at the junction between the premises owner's equipment and the utilities' equipment (the socket). This creates an ambiguous situation to who is at fault and has public relations consequences for the utility. It is therefore important to the utility to remedy this issue even if the damage is not caused by their equipment directly.

One way to mitigate this issue is to provide technicians with a tool that can measure the amount of mechanical, clamping-force the jaws are applying to the blades. If the force is outside of an acceptable range, it is more likely that a hot socket could occur with respect to that blade. This solution is ineffective, however, because it requires manual inspection with an additional tool of every blade in every existing meter, which is impractical for a technician. It would be desirable to mitigate this problem in manner that does not consume excessive additional time for technicians and does not add additional tools for the technician to complete their job.

SUMMARY OF THE INVENTION

Figure 1:
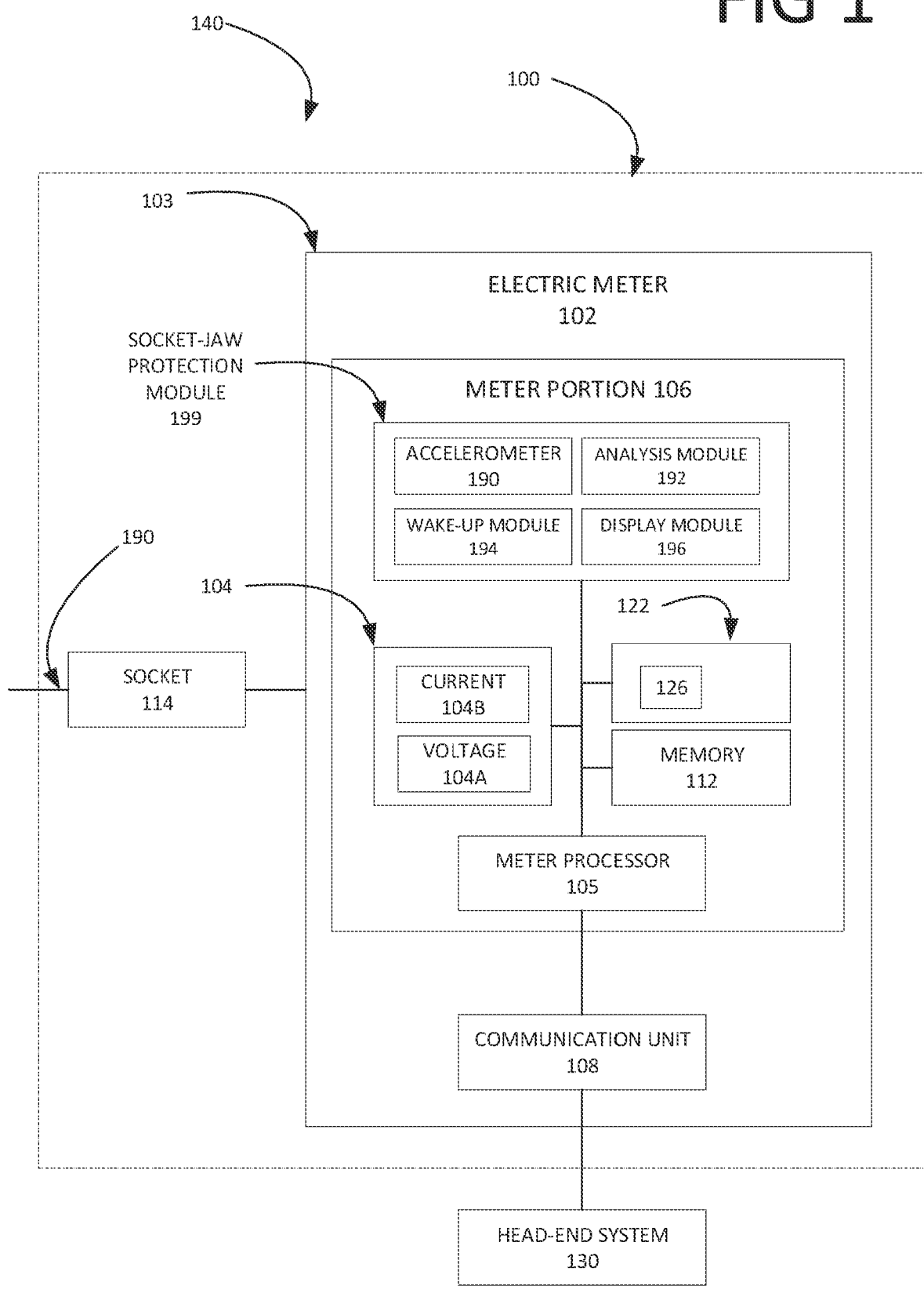
FIG. 1 is a block diagram of a device that includes a socket-jaw protection module according to one embodiment.

This Summary is provided to introduce a brief selection of disclosed concepts in a simplified form that are further described below in the Detailed Description including the drawings provided. This Summary is not intended to limit the claimed subject matter's scope.

One embodiment is a device, which comprises a meter portion having one or more blades, the blades configured to reside within both a premises-side opening and a utility-side opening within a socket, a supply unit connected to the meter portion, a metering unit connected to the supply unit and configured to measure an amount of electricity that passes through the meter portion, and a sensor connected to the meter portion, wherein when the meter portion is placed in the socket, the sensor collects data associated with the placing of the meter portion in the socket.

Another embodiment is a method comprising enabling a computing module and a storage module within a meter portion, receiving placement of the meter portion into a socket, the meter portion having one or more blades, the blades configured to reside within both a premises-side opening and a utility-side opening within the socket, using a sensor connected to the meter portion to collect data associated with the placing of the meter portion in the socket, and storing the data in the storage module.

In another embodiment, a method includes providing a procedure for a technician to place a meter portion into a socket, the meter portion having one or more blades, the blades configured to reside within both a premises-side opening and a utility-side opening within the socket, using a sensor connected to the meter portion to collect data associated with the placing of the meter portion in the socket, sending the data to a head-end system, analyzing the data at the head-end system, and sending an alert to the technician, based on the data sent to the head-end system.

DETAILED DESCRIPTION OF THE INVENTION

Disclosed aspects are described with reference to the attached FIGs, wherein like reference numerals are used throughout the FIGs to designate similar or equivalent elements. The FIGs are not drawn to scale and they are provided merely to illustrate certain disclosed aspects. Several disclosed aspects are described below with reference to example applications for illustration. It should be understood that numerous specific details, relationships, and methods are set forth to provide a full understanding of the disclosed aspects.

FIG. 1 is a block diagram of a device 140 that includes an electric meter 102 having a meter shell 103. An accelerometer 195 can be positioned on a PCB of the meter portion 106, where the electric meter 102 can be configured to implement a socket protection module 199 at a premise. As shown, the electric meter 102 comprises a meter portion 106 generally implemented on the PCB including measurement circuitry 104 including a voltage measurement circuit 104A and a current measurement circuit 104B for measuring the amount of electricity that is being consumed.

The electric meter 102 also includes a meter processor 105 such as a microprocessor or other computing device. The meter processor 105 has an associated memory 112 which can be accessed to run algorithms stored in the memory 112 and can be used to store functions for a controller to control the overall operation of the electric meter 102. The memory 112 is generally also for storing program instructions. Although not shown, a display is generally also included for displaying at least the meter data, status information, an alert, and/or information associated with the current installation. As will be further described below, a display module 196 in the socket protection module 199 can be used to this end, in one example.

The electric meter 102 besides the meter portion 106 comprises a communications unit 108 that can be a wireless communications unit, generally comprising a transceiver that can be coupled to an antenna, for wirelessly transmitting and receiving data to/from other electric meters that may be equivalent to electric meter 102, and/or to a head-end system 130. The wireless communication unit 108 may comprise, for example, a CC1110Fx/CC1111fX semiconductor device available from Texas Instruments Incorporated® which comprises a Low-Power SoC (System-on-Chip) with MCU, memory, Sub-1 GHz RF Transceiver, and a USB controller.

Within the utility box 100 is also a meter socket 114 which is coupled between the other components of the electric meter 102 and the power lines shown as 190. The power lines 190 electrically connect to the meter socket 114 to supply power to a premise from the utility company. The electrical power received from the power lines 190 may be routed through the meter socket 114 to allow the blades of the electric meter 102 (see blades 303 in FIG. 2 described below) to be positioned in the openings of the meter socket 114 to monitor the power levels consumed within the premises.

The blades are generally sized to be positioned within openings of the meter socket 114. Positioning the blades of the electric meter 102 within the meter socket 114 electrically connects the electric meter 102 to the meter socket 114. The meter socket 114 may include springs or other features to provide a tension force on the blades to maintain the position of the blades within the opening of the meter socket 114. The meter socket 114 and blades may each include one or more surfaces made out of an electrically conductive material to allow electricity to flow between the meter socket 114 and the blades.

The measurement circuitry 104 using its voltage sense circuit 104A and current sense circuit 104B measures the power consumed by the premises from the electrical signals supplied to the premises through the power lines 190. The voltage sense circuit 104A may be connected to electric load terminals in the electric meter 102, which are connected to the meter socket 114 using the blades of the electric meter 102. The voltage sense circuit 104A generally includes amplifiers, resistors, or other electrical devices to generate a voltage sense signal corresponding to an instantaneous voltage from the power lines 190.

The current sense circuit 104B may include, for example transformers, inductors, or other coils connected to the meter socket 114 via the blades of the meter system 102 to generate a current sense signal corresponding to an instantaneous current flowing from the power lines 190 through the meter socket 114. Voltage sense signals and current sense signals generated by the voltage sense circuit 104A and the current sense circuit 104B can be routed to the meter processor 105 for monitoring the signals and determining the power consumed by the premises. Based on one or more of the voltage sense signals and current sense signals, measurements may be generated by the meter processor 105.

The meter processor 105 may comprise one or more processors communicatively coupled to the memory device 112. The meter processor 105 is configured to execute instructions stored by the memory device 112, and for example includes a logical processing unit, a microprocessor, a digital signal processor, or another processing for processing the signals received from the voltage sense circuit 104A and the current sense circuit 104B. The memory device 112 device can include includes volatile or non-volatile, random-access memory (RAM), electrically erasable programmable read-only memory (EEPROM), or other readable and writeable memory devices. For example, the memory device 112 may include a non-volatile memory that stores data representing the measurements received from the voltage sense circuit 104A and the current sense circuit 104B.

The meter portion 106 also optionally includes disconnect circuitry 122 which is a conventional feature provided by most commercially available smart electric meters. During operation, a system, such as a central system or head-end 130, responsive to the alert signal sent by the electric meter will send a signal to the electric meter commanding the disconnect circuitry 122 to implement a disconnection. In some aspects, the disconnect circuitry 122 includes a switching device or other circuitry for disconnecting the power supplied from the power lines 190 to the premises through the meter socket 114. Disconnecting the power may include interrupting electrical signals that are transmitted between the meter socket 114 and the electric meter 102.

The disconnect circuitry 122 may also include an actuator 126 coupled to the switching device. The actuator 126 may cause the switching device of the disconnect circuitry 122 to transition from a first position that allows power to flow into the premises to a second position that prevents the power from flowing into the premises, and from the second position to the first position. The actuator 126 may be communicatively coupled to the meter processor 105, which can transmit control signals to the disconnect circuitry 122 to allow the meter processor 105 to operate the switching device.

The communications unit 108 through its associated antenna 107 is shown communicatively coupled to a central system 130, such as a central system associated with an operator of the power utility. In some disclosed aspects, the communication unit 108 may transmit a signal associated with the utility box 100. For example, one aspect uses a socket protection module 199 during an installation procedure. In this case, a technician will remove an existing meter portion and swap it with a new one. This could be in the case of replacing an older meter with a smart meter, a new installation, a new meter portion where the old one experienced a hot socket, and the like.

When a technician performs one of the procedures described above, the socket protection module 199 operates to ensure that the installation procedure is compliant with a process that ensures a proper installation (e.g., proper clamping force from the jaws on the blades). Thus, the socket protection module 199 operates to ensure that the installation is less likely to result in a hot socket in the future, and hence, is least likely to cause catastrophic damage. To this end, the socket protection module 199 has a wake-up module 194, which could be coupled to a physical button on the meter, or other suitable input mechanism, to indicate to the meter that the installation process is beginning, and it should enter a more active mode of processing that can include activating one or more processing units and/or memory areas, such as meter processor 105 and memory 112. The wake-up module 194 can be powered by a battery or capacitor, for example.

The socket protection module 199 can also include a display module 196 for preparing information for the technician, so it can be displayed on a display to assist the technician in achieving a compliant installation. When the meter portion 106 is being installed, the accelerometer 199 can collect data, for example including the acceleration of the meter portion 106 into the socket 114, the deceleration of the meter portion 106 into the socket 114, and/or the amount of force the technician is using to push the meter portion 106 into the socket 114. The meter processor 105 will process the data and store it in the memory 112. In another example, the blades are formed in a plurality of rows and the technician performs a "rocking" motion with the meter portion 106. By using a rocking motion, a first row of blades is pushed in before a second row of blades. In this manner, the data can include an installation profile that includes the data from the accelerometer 195 each time the technician performed the rocking motion and pushed in a row of blades.

An analysis module 192 is included in the socket protection module 199. The analysis module 192 connects to the head-end system 130 via the communication unit 108. The analysis module 192 is capable of providing the data from the accelerometer 195 to the head-end system 130, from the installation of the meter portion 106. The head-end system 130 can use the data from the analysis module 192 to gather data from a plurality of installations at a plurality of meter. The head-end system 130 is capable of using artificial intelligence (AI) to better understand the parameters that lead to less likelihood of a hot socket. The head-end system 130, in turn, can use the data to revise the procedures, that can later be used by the display module 196 to update a technician with better information and a safer procedure. Alternatively, an alert can be sent from the head-end system 130 to the display module 196, to prepare an alert for the display of the meter, in order to alert the operator that there is a problem with the installation.

In the case where the electric meter 102 comprises a smart meter, this enables two-way communication between the electric meter 102 and the head-end system 130. Communications from the electric meter to the network as noted above may be wireless, or via a fixed, wired connections. Wireless communication options include cellular communications, Wi-Fi, wireless ad hoc networks over Wi-Fi, wireless mesh networks, low power long-range wireless (LoRa), ZigBee (low power, low data rate wireless), and Wi-SUN (Smart Utility Networks).

Figure 2:
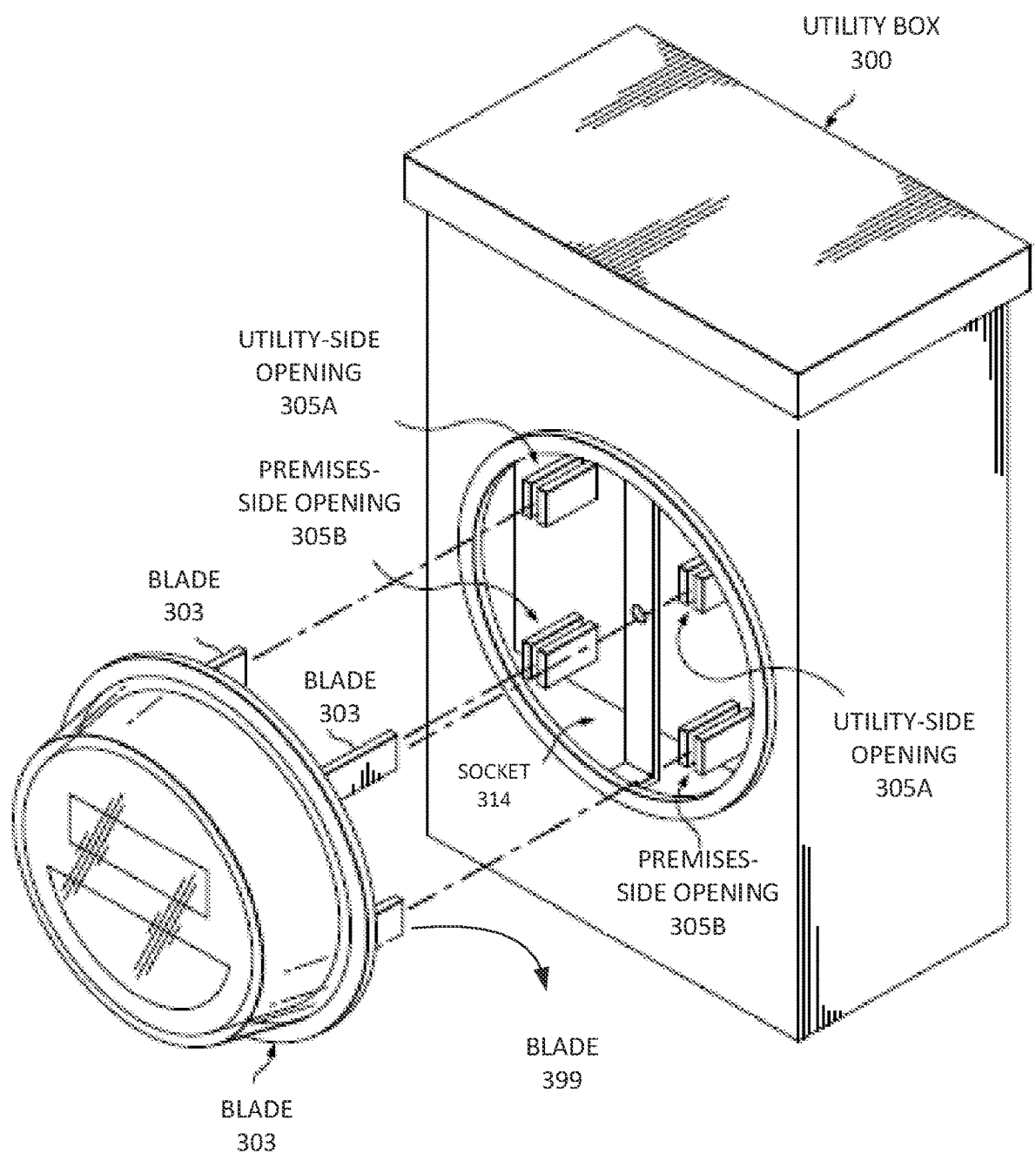
FIG. 2 shows an electric meter having blades configured for insertion into openings of a socket according to one embodiment.
Figure 3:
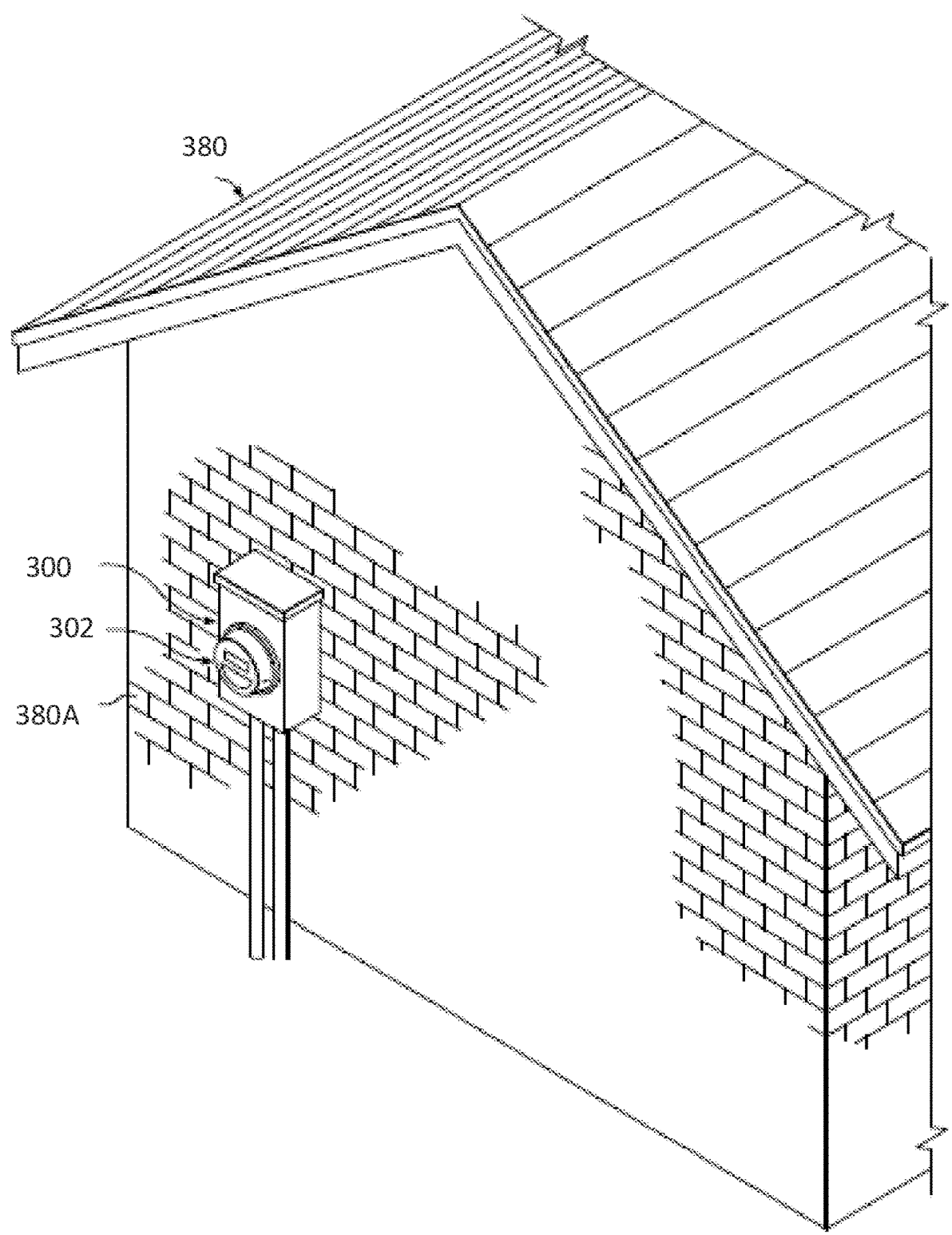
FIG. 3 shows an electric meter installed on a of a premises.

FIG. 2 shows an electric meter 302 having blades 303 and 399 configured for insertion into openings shown as utility-side openings 305A and premises-side openings 305B of a meter socket 314. FIG. 3 shows the electric meter 302 installed on a wall 380A of a premise 380. The utility box is shown as 300. The openings 305A and 305B are sized and configured so that the blades 303 (not visible in FIG. 3) may be positioned therein. The electric meter 302 may be fitted into the meter socket 314, as indicated by the dotted lines shown in FIG. 2, such that the blades 303 (visible in FIG. 2) are positioned in the openings 305A, 305B.

Positioning the blades 303 within the openings 305A, 305B electrically connects the electrical meter 302 to the meter socket 314. In one aspect a first row of blades, shown as the bottom row of FIG. 2, which includes a blade 399, is positioned below the second row of blades 303. In one installation procedure, blade 399 is positioned into the socket 314 alternatively from blades 303 in a rocking motion, wherein each row of blades is pushed into the socket 314 individually until all the rows are completely inserted.

The blades 303 and 399 and the utility-side openings 305A can be configured such that electrical signals are transmitted between a utility-side of the meter socket 314 and the electrical meter 302, and the premises-side openings 305B are configured such that electrical signals are coupled between the electric meter 302 and a premises-side of the meter socket 314. The electric meter 302 can be configured such that disconnect circuitry (such as disconnect circuitry 122 described above) allows the electrical signals to be transmitted between the utility-side and the premises-side. For example, the disconnect circuitry 122 may be configured such that triggering the actuator 126 may interrupt the transmission of the electrical signals between the utility-side and the premises-side by interrupting the transmission of electrical signals between the blades 303 on the utility-side and the blades 303 on the premises-side of the electric meter 302.

Figure 4:
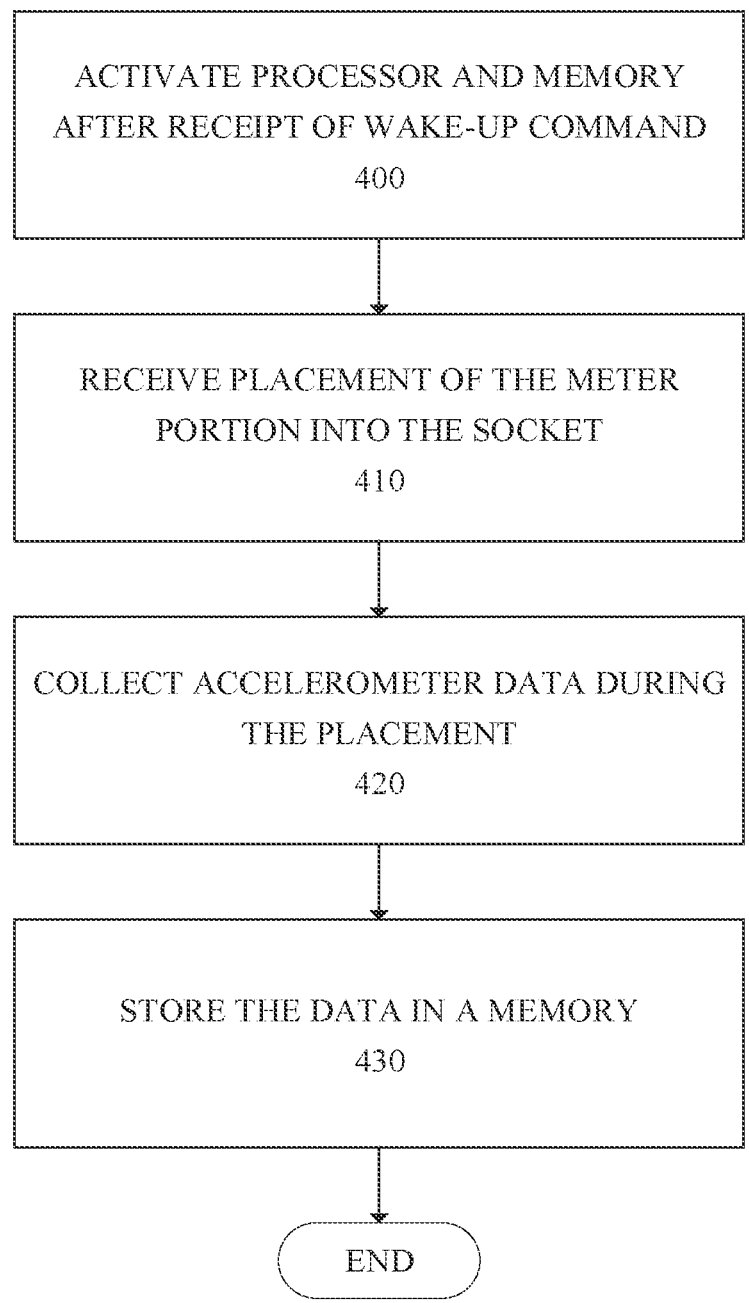
FIG. 4 is a flowchart showing an implementation of the socket-jaw protection module according to one embodiment.

FIG. 4 is a flowchart showing an implementation of the socket-jaw protection module according to one embodiment. At step 400, a processor and memory are awakened after a device receives a wake-up command. This can occur, for example, during an installation procedure of an electric meter. The meter can be awakened using a battery, a super-capacitor, or other internal power source. At step 410, a meter portion is placed into a socket, for example by a technician, and the meter portion is received into the socket by the device. In one embodiment, there are a plurality of rows of blades and the technician performs a rocking motion, wherein each of the rows of blades is pushed in at different times, although this is not required. There may also be a checklist the technician uses and/or an installation profile for the meter which the technician uses. At step 420, sensor data is collected during the placement of the meter body. This includes, for example, an accelerometer and the readings it takes (3-axis data, for example) as the meter is installed into the socket. At step, 430 the data is stored in a memory.

Figure 5:
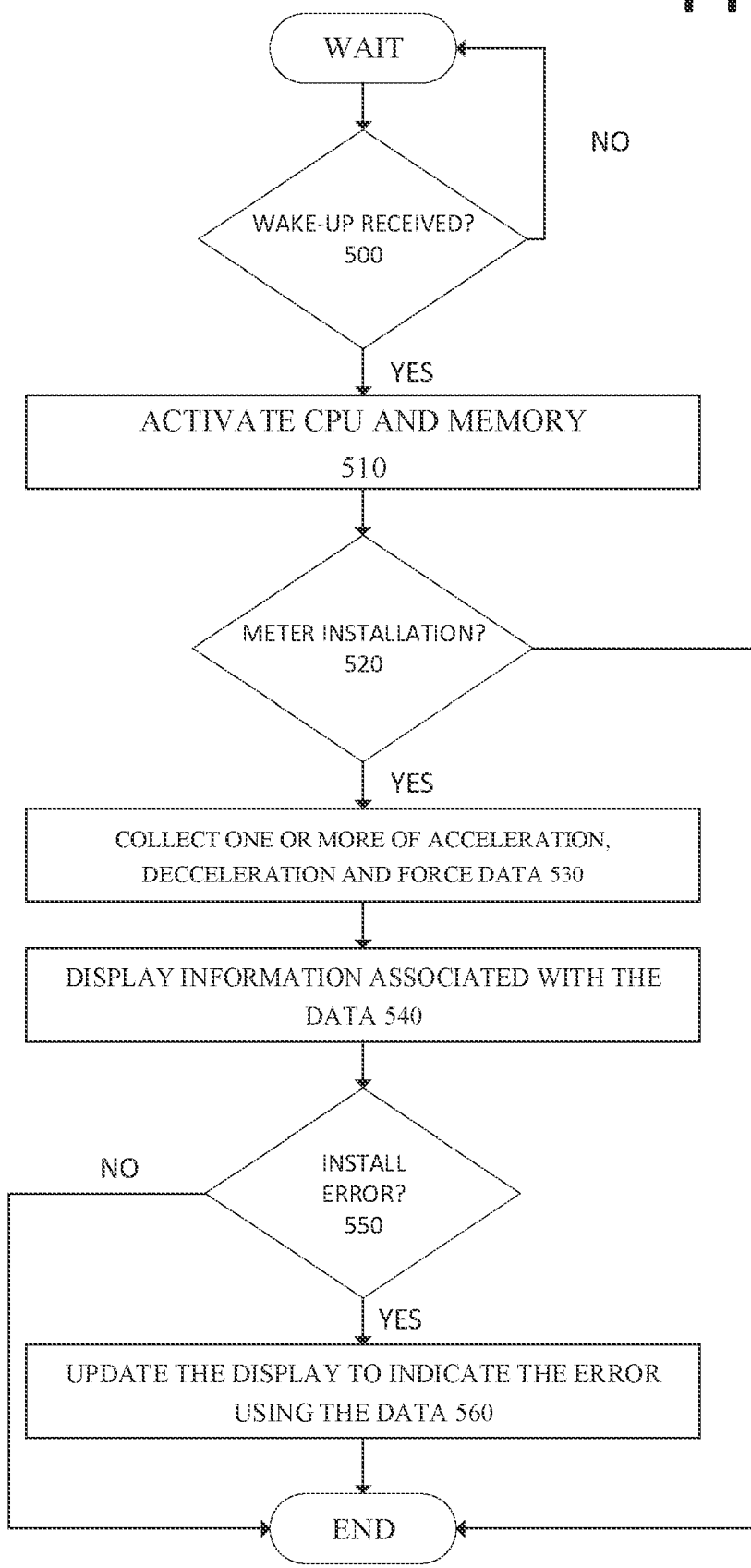
FIG. 5 is a flowchart showing an implementation of the socket-jaw protection module according to another embodiment.

FIG. 5 is a flowchart showing an implementation of the socket-jaw protection module according to another embodiment. At step 500, it is determined whether a wake-up command has been received. For example, there may a dedicated button or buttons on the meter, or a combination of button actions that could be used to wake up the meter. The device waits until the command is received and wakes up a CPU and memory in response at step 510. A battery or super-capacitor can be used, for example, and the memory can be a form of resilient storage capable of operating without the power supply.

At step 520, the system determines whether a meter installation is occurring. If not, the process ends. If so, the at step 530, a sensor collects one or more readings associated with the installation. In one example, this includes the acceleration of the meter into the socket, the deceleration of the meter into the socket, and/or an amount of force the technician is using to push the meter into the socket. Other sensor readings can be used as well, and in one example one or more 3-axis accelerometers are used. At step 540, information associated with the installation is displayed to the technician. This can include the sensor readings themselves, information about whether the sensor readings indicate a compliant installation procedure that will minimize the chance of a hot socket, warning signals, information associated with an installation profile and whether the installation matches the profile, and others. In another example, a socket jaw protection module (such as the socket-jaw protection module 199 of FIG. 1) can use a display module and/or a coupling to a head-end to determine the information to display at step 540.

At step 550, the system determines whether there is an error in the install. For example, the acceleration of the meter body into the socket might be too high, or the force might be too low, or the procedure didn't follow the installation profile. If not, the process ends, and the meter is successfully installed. If there is an error, the display is updated at step 560, based at least in part on the sensor readings, to indicate to the technician that the installation was erroneous.

Figure 6:
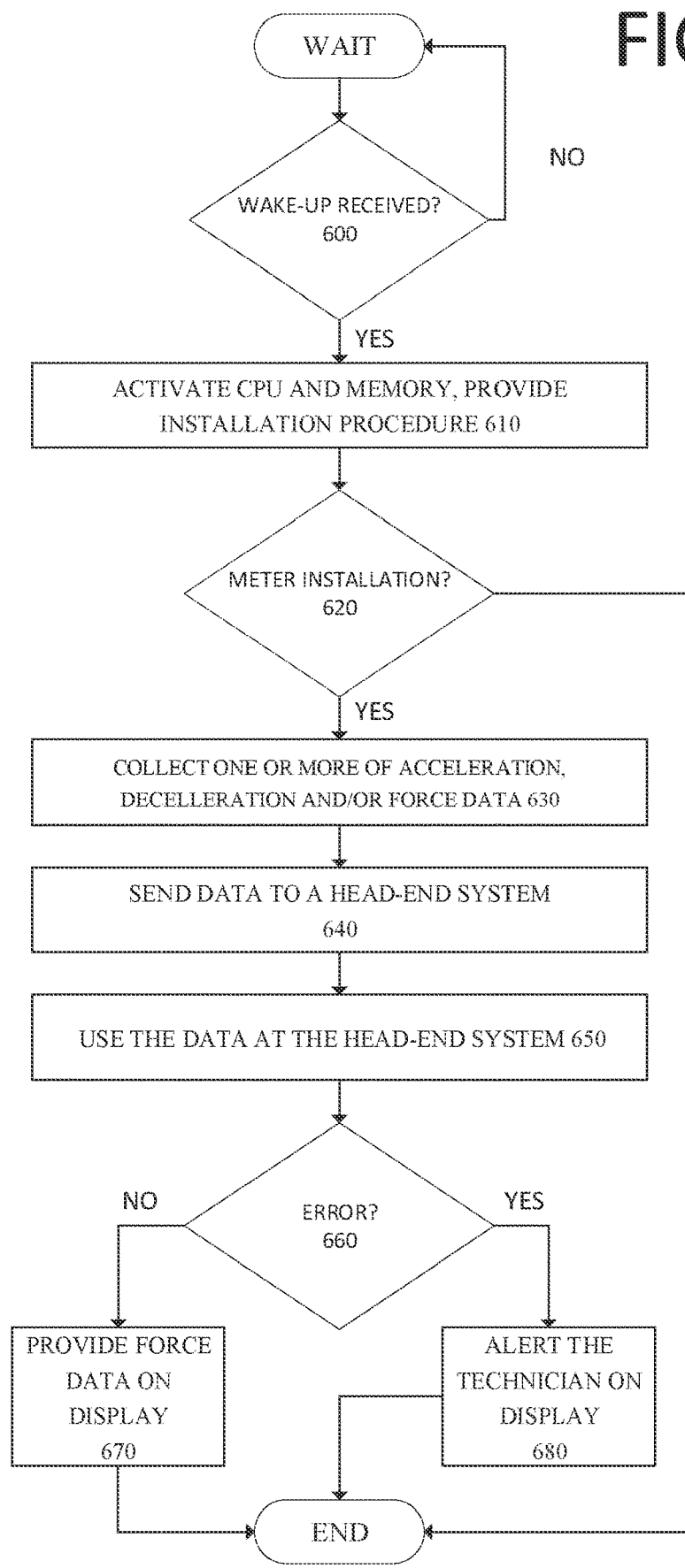
FIG. 6 is a flowchart showing an implementation of the socket-jaw protection module according to another embodiment.

FIG. 6 is a flowchart showing an implementation of the socket-jaw protection module according to another embodiment. At step 600, it is determined whether a wake-up command has been received. For example, there may a dedicated button or buttons on the meter, or a combination of button actions that could be used to wake up the meter. The device waits until the command is received and wakes up a CPU and memory in response, as well as providing an installation procedure at step 610. In one example, the installation procedure can include a checklist for the technician. In another example, an installation profile is loaded into the memory and is used in real-time during this process. At step 620, the system determines whether a meter installation is occurring. If not, the process ends. If so, the at step 630, a sensor collects one or more readings associated with the installation, for example with an accelerometer.

At step 640, the data is sent to a head-end system. This can include, for example, sending a plurality of 3-axis data from one or more accelerometers to the head-end. The head-end uses this data at step 650. For example, the head-end can apply one or more algorithms to the data in order to perform an analysis. In another example, mathematical, statistical, and/or analytical modeling is used on the data and the head-end can estimate an amount of insertion force that was used during the installation. In another example, an artificial intelligence (AI) process can be used by the head-end. The AI process can train, classify, and/or otherwise use the data and additional data from other installations, for example, to tailor a response, if needed, that uses more information than is available merely from the sensor of the current meter.

At step 660, the head-end determines whether an error has occurred in the installation (e.g., one that may increase the risk of a hot socket). If not, the head-end returns information to the display at step 670. The information can indicate, for example, the amount of insertion force used during the installation. Otherwise, at step 680, an alert is provided on the display. This can be used, for example, to indicate to the technician that the error occurred. After step 670 or 680 the process ends.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A device comprising:
 a meter portion having one or more blades, the blades configured to reside within both a premises-side opening and a utility-side opening within a socket;
 a supply unit connected to the meter portion;
 a metering unit connected to the supply unit and configured to measure an amount of electricity that passes through the meter portion;
 a sensor connected to the meter portion, wherein when the meter portion is placed in the socket, the sensor collects data associated with the placing of the meter portion in the socket,
 wherein when the meter portion is placed in the socket, the sensor collects data associated with a first row of blades before it collects data associated with a second row of blades of the one or more blades.

2. The device of claim 1, wherein the sensor is an accelerometer.

3. The device of claim 2, wherein the data associated with the placing of the meter portion in the socket includes one or more of an insertion force on the meter portion, an acceleration of the meter portion, or a deceleration of the meter portion as it moves into the socket.

4. The device of claim 3, further comprising an input module for receiving a wakeup input and activating the sensor before the sensor collects data associated with the placing of the meter portion in the socket.

5. The device of claim 4, further comprising a display for displaying the data associated with the placing of the meter portion in the socket.

6. The device of claim 4, further comprising a communication unit for sending the data associated with the placing of the meter portion in the socket to a head-end system.

7. A method comprising:
 enabling a computing module and a storage module within a meter portion;
 receiving placement of the meter portion into a socket, the meter portion having one or more blades, the blades configured to reside within both a premises-side opening and a utility-side opening within the socket;
 using a sensor connected to the meter portion to collect data associated with the placing of the meter portion in the socket, wherein when the step of using the sensor includes collecting data associated with the first row of blades before collecting data associated with the second row of blades of the one or more blades; and
 storing the data in the storage module.

8. The method of claim 7, wherein the sensor is a three-axis accelerometer.

9. The method of claim 7, further comprising displaying the data on a display associated with the meter portion.

10. The method of claim 7, wherein the step of using the sensor includes one or more determining a force on the meter portion, determining an acceleration of the meter portion, or determining a deceleration of the meter portion.

11. The method of claim 7, wherein the step of enabling the computing module and the storage module further comprises receiving a wake-up input and activating the sensor.

12. The device of claim 7, further comprising using a communication unit to send the data to a head-end system.

13. A method comprising:
 providing a procedure for a technician to place a meter portion into a socket, the meter portion having one or more blades, the blades configured to reside within both a premises side opening and a utility-side opening within the socket;

using a sensor connected to the meter portion to collect data associated with the placing of the meter portion in the socket, wherein when the step of using the sensor includes collecting data associated with the first row of blades before collecting data associated with the second row of blades of the one or more blades;

sending the data to a head-end system;

analyzing the data at the head-end system; and sending an alert to the technician, based on the data sent to the head-end system.

14. The method of claim 13, wherein the step of analyzing the data further comprises using a classifier to improve the data.

15. The method of claim 13, wherein the step of analyzing the data further comprises training the data.

16. The method of claim 13, wherein the step of analyzing the data further comprises using an installation profile, the installation profile being based on the data sent to the head-end system.

* * * * *